United States Patent
Yoo et al.

(10) Patent No.: US 6,879,778 B2
(45) Date of Patent: Apr. 12, 2005

(54) BATCH FURNACE

(75) Inventors: Woo Sik Yoo, Palo Alto, CA (US); Takashi Fukada, Kumamoto (JP)

(73) Assignee: WaferMasters, Inc., San Jose, CA (US)

( * ) Notice: Subject to any disclaimer, the term of this patent is extended or adjusted under 35 U.S.C. 154(b) by 146 days.

(21) Appl. No.: 10/313,707

(22) Filed: Dec. 5, 2002

(65) Prior Publication Data

US 2004/0022528 A1 Feb. 5, 2004

Related U.S. Application Data

(63) Continuation-in-part of application No. 10/211,757, filed on Aug. 2, 2002, now Pat. No. 6,727,194.

(51) Int. Cl.$^7$ ................................................ F26B 19/00
(52) U.S. Cl. ........................ 392/416; 392/418; 219/390; 219/405; 219/411; 118/724; 118/725; 118/50.1
(58) Field of Search ................................. 219/390, 405, 219/411; 392/416, 418; 118/724, 725, 50.1

(56) References Cited

U.S. PATENT DOCUMENTS 4,723,508 A   2/1988   Yamazaki et al.
6,191,388 B1   2/2001   Cleaver et al.
6,259,061 B1 * 7/2001   Osawa ........................ 219/390
6,407,368 B1   6/2002   Hsu et al.
6,444,940 B1 * 9/2002   Saito et al. .................. 219/390

FOREIGN PATENT DOCUMENTS

WO        WO 98/39609        9/1998

* cited by examiner

*Primary Examiner*—Shawntina Fuqua
(74) *Attorney, Agent, or Firm*—MacPherson Kwok Chen & Heid LLP; Tom Chen

(57) ABSTRACT

A system and method for isothermally distributing a temperature across a semiconductor device. A furnace assembly is provided, which includes a processing tube configured to removably receive a wafer carrier having a full compliment of semiconductor wafers. A heating assembly is provided which can include a heating element positioned to heat air or other gases allowed to enter the process tube. The furnace assembly and process tube are capable of being vertically raised and lowered into a position enclosing the heating assembly within the process tube. Once the heating assembly forms a seal with the process tube, the process tube is exhausted and purged of air. Gas is then allowed to flow into the process tube and exchange heat with the heating element. The heated gas circulates through the process tube to convectively change the temperature of the wafers.

18 Claims, 9 Drawing Sheets

BATCH FURNACE

This application is a continuation-in-part of U.S. patent application Ser. No. 10/211,757, filed Aug. 2, 2002 now U.S. Pat. No. 6,727,194, which is herein incorporated by reference for all purposes.

BACKGROUND

1. Field of the Invention

This invention generally relates to semiconductor manufacturing equipment and, more particularly, to a system and method used for the processing of semiconductor wafers.

2. Description of the Related Art

During the processing of semiconductor devices, it is highly desirable to accurately control the thermal treatment to which the devices are exposed during processing. In some instances, batches of devices, primarily wafers, are processed in a semiconductor processing furnace, which has a carefully controlled processing environment to effect the desired processes.

Unfortunately, it has been found that in most conventional vertically arranged furnaces, the desired temperature is obtained in the process tube by surrounding the tube with heating elements. In this arrangement radiation and convection are used to heat the process tube first, before the heat energy is transferred to the cooler wafers. Convective heating is usually not effective because the process tube is typically isolated. During low temperature wafer processing operations, this type of heating arrangement is usually very inefficient and time consuming. Further, in this type of arrangement, a separate cooling chamber or blower for fast cooling of the entire furnace, is typically required since, it is difficult and inefficient to lower the temperature of the entire furnace assembly between processing operations on different batches of wafers.

For the above reasons, what is needed is a system and method for isothermally distributing a temperature across the surface of a semiconductor device which provide an accurate dynamic control of the process temperature, without degradation in uniformity of the processed wafers.

SUMMARY

The present invention provides a system and method for isothermally distributing a temperature across a semiconductor device. A furnace assembly is provided, which includes a processing tube configured to removably receive a wafer carrier having a full compliment of semiconductor wafers. A heating assembly is provided which can include a resistive heating element positioned to heat air or other gases allowed to enter the process tube. The furnace assembly and process tube are capable of being vertically raised and lowered into a position enclosing the heating assembly within the process tube. Once the heating assembly forms a seal with the process tube, the process tube is exhausted and purged of air. Gas is then allowed to flow into the process tube and exchange heat with the heating element. The heated gas circulates through the process tube to convectively change the temperature of the wafers.

The heating assembly can include a resistive heating element, which is positioned to heat air or other gases allowed to enter the process tube. The heating assembly can also include a reflector device, which can direct gas flow around the heating element and through the process tube.

In operation, the furnace assembly is vertically lowered into a position over the wafer carrier and heating assembly using an actuation mechanism. Once the heating assembly forms a seal with the process tube, the process tube is exhausted or purged of air. Gas is allowed to flow into the process chamber through an inlet. The gas exchanges heat with the heating element. As the gas is made to circulate through the process tube. The reflector acts to cause the gas to circulate from the bottom end of the process tube back to the top end of the process tube. The uniform convective heating uniformly raises the temperature of the wafers.

After the wafers are processed, the heating element is powered down and a non-heated gas is allowed to flow through the process tube. The non-heated gas cools down the wafers before their removal. Once cooled, the actuation mechanism is used to raise the furnace assembly from over the wafer carrier and heating assembly.

Advantageously, heating and cooling of the wafers occurs internal to the process chamber using a convective type of heating. The heat transfer between the circulating heated gas and the wafers is more direct than using radiation or other forms of conduction heating arrangements. Because the wafers are cooled within the process chamber, a separate cooling chamber or blower is not required. Since the heating element has a small thermal mass, rapid ramp-up and ramp-down times are achievable.

These and other features and advantages of the present invention will be more readily apparent from the detailed description of the embodiments set forth below taken in conjunction with the accompanying drawings.

DETAILED DESCRIPTION

Figure 1:
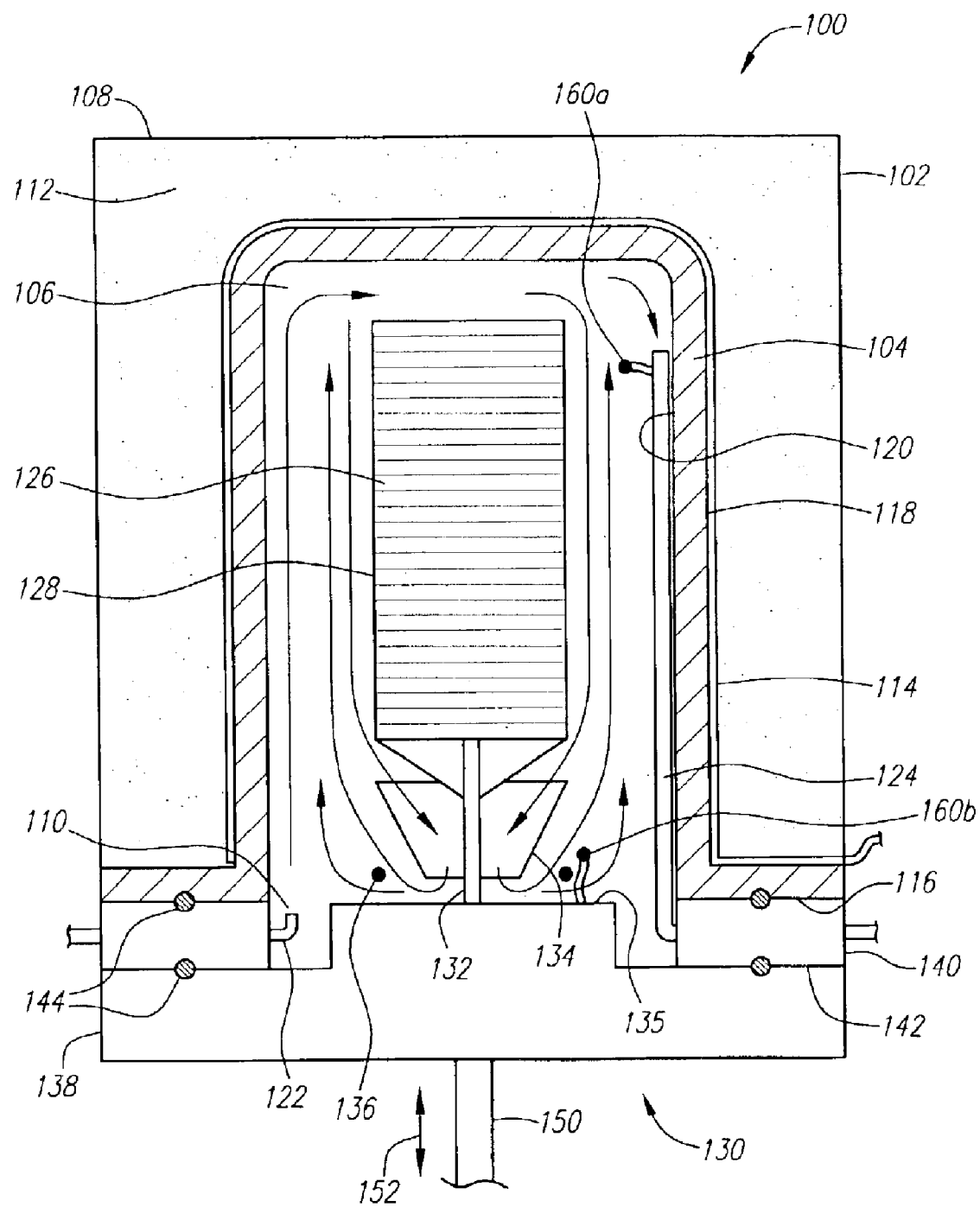
FIG. 1 is a simplified cross-sectional view of one embodiment of the present invention.

FIG. 1 is a simplified cross-sectional view of one embodiment of the furnace assembly 100 of the present invention. Furnace assembly 100 includes a process chamber 102 enclosing process tube 104, which defines an internal space 106.

Externally, in one embodiment, process chamber 102 may include a metallic housing 108, preferably made of aluminum, stainless steel, or similar metal. Within housing 108, between housing 108 and process tube 104, may be an internal thermal insulation material 112. Insulation material 112 helps to minimize heat loss from process tube 104 through housing 108 to the outside environment. Optionally, a heating element 114 may be disposed between process tube 104 and insulation layer 112 to increase the temperature around process tube 104, which further minimizes heat loss through housing 108 to the outside environment and to reduce time for the temperature within process tube 104 to stabilize. Insulation material 112 may be made of any suitable insulation material, such as a ceramic fiber material.

Process chamber 102 includes an opening 110 provided on a bottom face 112. Opening 110 is configured to receive a wafer carrier or wafer boat, including wafers for processing. Opening 110 allows for the loading and unloading of the wafer carrier from process tube 104 before and after processing.

Process tube 104 is mounted within process chamber 102. In one embodiment, process tube 104 is preferably shaped in a form similar to a bell jar. The bell jar shaped tube has a shell with an outer surface 118 and an inner surface 120. Inner surface 120 defines the perimeter of process tube 104 and interior cavity 106. Process tube 104 is formed such that interior cavity 106 has a minimal internal volume to surround the wafer carrier holding the batch of wafers. Generally, process tube 104 may be configured to withstand internal pressures of about 0.001 Torr to 1000 Torr, preferably between about 0.1 Torr and about 760 Torr.

Process tube 104 can be used to provide processing of semiconductor wafers involving exposing the batch of semiconductor wafers to various chemicals, particularly gases, at various temperatures, as is well-known, for example, in thermal heat treatments and chemical vapor deposition (CVD) processes. During such processes, processing tube 104 can be supplied with the desired processing gases via inlet tube 122. The out flowing gases are discharged through discharge tube 124. The inlet to discharge tube 124 is positioned near the portion of process tube 104 away from opening 110, the top portion, to ensure that the gases do not pool the top portion. Process tube 104 can be made from quartz or other similar material.

As shown in FIG. 1, a wafer carrier 128 is provided, which is capable of holding a plurality of wafers 126 in an array configured for processing. Wafer carrier 128 is formed of quartz or other suitable materials. Process tube 104 and wafer carrier 128 are constructed so as to be arranged in a coaxial arrangement, in which wafer carrier 128 can be removably received within process tube 104 as described in more detail below.

In one embodiment, wafer carrier 128 has a series of wafer receivers, advantageously formed by notches, each notch being capable of holding a wafer in position during processing. Wafer carrier 128 can be designed to hold any desired number of wafers 126, but preferably wafer carrier 128 can hold between about 25 and 50 wafers. In one embodiment, wafer carrier 104 may be configured to be coupled to a platform, which is configured for vertical movement to allow the wafer array to be installed and/or removed from process tube 104.

Figure 2:
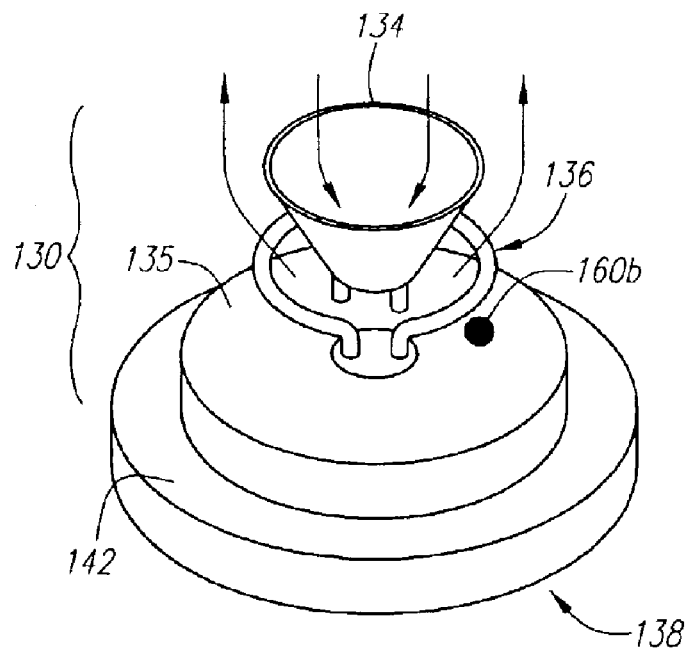
FIGS. 2, 3, 4 and 5 are simplified perspective views of heating assemblies in accordance with embodiments of the present invention.

FIGS. 1 and 2 show an embodiment of heating assembly 130, which is configured as a means for providing the vertical movement which drives wafer carrier 128 into process tube 104. In addition to moving the wafer carrier, heating assembly 130 is configured to mate with opening 110 and seal process tube 104 during processing. In one embodiment, heating assembly 130 also includes a means for mounting a wafer carrier 132, a reflector 134, and a heating source 136 all mounted on a working surface 135 of a base or platform 138 capable of being vertically actuated using an elevation device 150.

The means for mounting 132 can include any structure capable of removably mounting wafer carrier 128 to platform 138. For example, mounting means 132 may be an open flange attached to a stem which connects the open flange to platform 138. The open flange can have a lip upon which wafer carrier 128 can be positioned. It should be understood that one of ordinary skill in the art will be able to identify multiple means for mounting 132 that are within the scope of the present invention.

The circulation of gas through process tube 104 can be facilitated using any device, which causes gas to move in a particular direction. In one embodiment, the circulation of gas through process tube 104 can be facilitated using reflector 134. Reflector 134 can be a funnel shaped device mounted at approximately the center of working surface 135 of platform 138. The funnel shape of reflector 134 can be used to direct the flow of gas near and around heating source 136. Reflector 134 also causes gases to continue to flow about wafer carrier 128 in the direction illustrated by the unnumbered arrows shown in FIG. 1. Reflector 134 can be made of Al, stainless steel, or other substantially non-reactive material. It should be understood that reflector 134 is but one example of a device that can be used to direct a gas through process tube 104.

Heat source 136 can be any heat source capable of providing the requisite heating capability needed for conducting wafer processes. For example, heat source 136 is capable of producing enough heat to cause the internal temperature of process tube 104 to rise to between about 100° C. and about 1200° C., preferably between about 100° C. and about 800° C.

In one embodiment, heat source 136 is a resistive heating element, such as a ring-shaped heating element. In this embodiment, the ring-shaped heating element is shown with reflector 134 positioned in the center of the ring; however, the placement of heat source 136 can vary between embodiments as shown below.

The resistive heating element may be any conventional heating element suitable for use in thermal processing applications. For example, the ring-shaped heating element may include a resistive heating element core wrapped by a filament wire. The core may be made of a ceramic material, but may be made of any high temperature rated, non-conductive material. The filament wire is conventionally wrapped around the core to allow for an optimal amount of radiated heat energy to emanate from the element. The filament wire may be any suitable resistively heatable wire, which is made from a high mass material for increased thermal response and high temperature stability, such as SiC, SiC coated graphite, graphite, AlN and $Al_2O_3$. Heating elements are available from Omega Engineering, Inc. of Stamford, Conn.

In other examples, the heating element may include metal sheath cartridge heaters and tubular heaters with compacted Magnesium Oxide (MGO) powder for electrical isolation.

In each embodiment, the heating elements are electrically connected to a power supply system via heating element connection terminals and associated wiring (not shown).

Heating assembly 130 is positioned on platform 138. In one embodiment, platform 138 can be made of a substantially non-reactive material, having a first tier defining working surface 135, upon which the components of heating assembly 130 may be mounted. The second tier defines lip portion 142 which is capable of interfacing with process chamber 102 to form a seal to enclose process tube 104. Platform 138 can be a machined structure, a molded structure or a similarly manufactured structure.

An elevation device 150 can be used to lift platform 138 up and down in the direction signified by arrow 152.

Elevation device 150 can be any well-known device cable of performing the lifting operation required to move heating assembly 130 via platform 138, into and out from internal cavity 106 of process tube 104. For example, elevation device 150 can include a pneumatic or hydraulic lift, a mechanical worm drive or any other linear actuation device known in the industry.

The sealing of process tube 104 occurs as lip portion 142 of platform 138 contacts a flange 140 or similar device formed as an interface between process chamber 102 and heating assembly 130. In one embodiment, inlet tube 122 and discharge tube 124 can be provided through flange 140 to extend into process tube 104. Seals 144 are positioned between the contacting portions of process chamber 102 and flange 140 and contacting portions of flange 140 and lip portion 142. Seals 144 allow process tube 104 to be hermetically sealed during processing.

Referring again to FIG. 1, temperature sensors 160a and 160b are operationally coupled to a temperature controller (not shown) and used to monitor the temperature variation within process tube 104. In one embodiment, temperature sensors 160a and 160b are strategically placed in process tube 104 to provide an indication of the temperatures being developed by heating source 136. For example, sensor 160a can be strategically positioned at the top end of process tube 104 away from heat source 136. Similarly, sensor 160b can be positioned proximate to heat source 136 to monitor the temperature at the beat source. In operation, as heat source 136 is being powered up to begin heating, a temperature differential between the top end and bottom end of process tube 104 can occur for a short duration of time. The temperature difference may range from between about 10° C. and about 100° C. Temperature sensors 160a and 160b can be used to regulate the power supplied to heat source 136 to ensure that the heat source is not overheating the bottom end of process tube 104 during the delay while the top end is coming up to the desired temperature. Temperature sensors 160a and 160b may be conventional R-type or K-type thermocouples available through, for example, Omega Engineering Inc. of Stamford, Conn.

Figure 3:
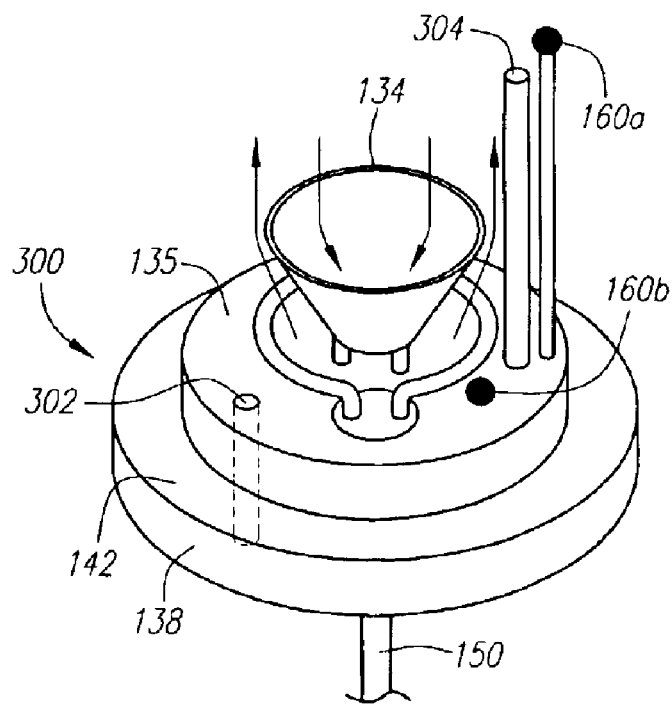
Figure 4:
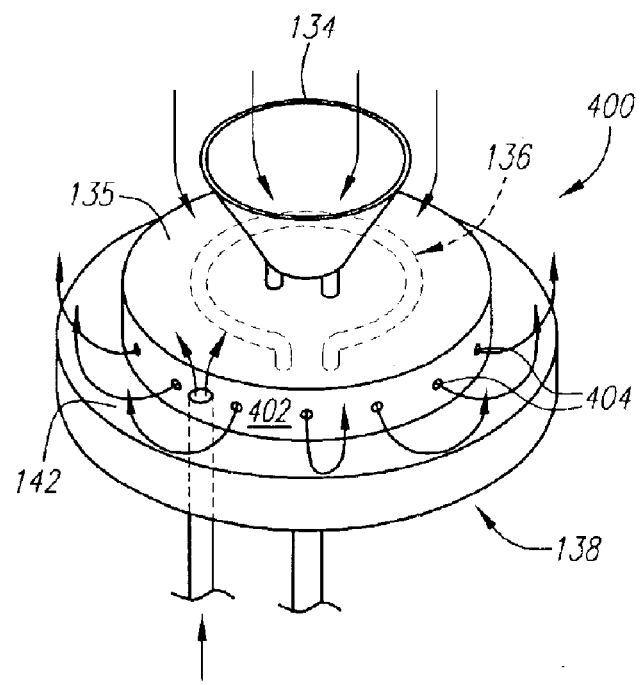
Figure 5:
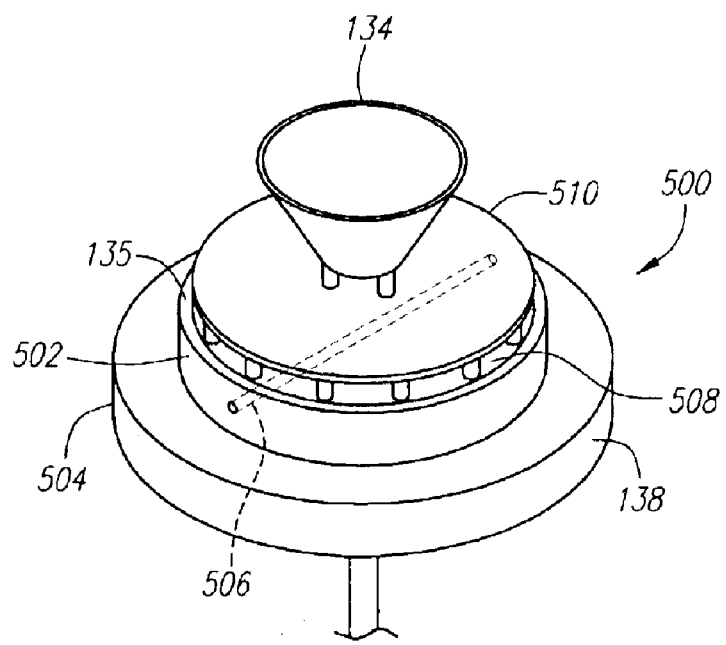

FIGS. 3, 4 and 5 are simplified illustration of heating assemblies in accordance with various embodiments of the present invention. In FIG. 3, heating assembly 300 includes, wafer carrier mounting means (not shown), reflector 134, and heat source 136 all mounted on working surface 135 of platform 138. The entire heating assembly 300 can be elevated into process tube 104 using elevation means 150.

In this embodiment, a gas inlet tube 302 is formed into platform 138 to allow gas to enter process tube 104 from an egress at working surface 135. Similarly, a discharge tube 304 can also be formed into platform 138. The ingress of discharge tube 304 extends a distance above working surface 135, such that the ingress is located at the top end of process tube 104 once platform 138 is in position to seal process tube 104.

In this embodiment, thermal sensors 160a and 160b are mounted upon working surface 135, such that the sensors enter the process tube along with heating assembly 300 and are positioned at the strategic locations identified above.

FIG. 4 is yet another embodiment of a heating assembly 400 in accordance with the present invention, including wafer carrier mounting means (not shown), reflector 134 and heat source 136. For ease of understanding, first tier 402 of platform 138 is shown as being see-through. In this embodiment, first tier 402 forms a hollowed-out chamber having a plurality of holes 402 defined around a perimeter of the tier. Heat source 136 is disposed within the hollowed out portion. A gas inlet 404 is formed though platform 138 with an egress into the hollowed-out portion of first tier 402. In this embodiment, heat source 136 heats gas entering the hollowed-out chamber of tier 402. The gas then escapes through holes 404 and into process tube 104.

FIG. 5 is an embodiment of a heating assembly 500 in accordance with the present invention, which uses radiation heating. Heating assembly 500 includes wafer carrier mounting means (not shown), reflector 134 and heat source 506. For ease of understanding, platform 138 is shown as being see-through. In this embodiment, first tier 502 and second tier 504 are both formed as hollowed-out chambers. Working surface 135 of first tier 502 includes a quartz window 508 having a heat diffusing member 510 disposed immediately thereabove. Heat diffusing member 510 may be positioned proximate to window 508 between working surface 135 and reflector 134. Heat diffusing member 510 may be any suitable heat diffusing material that has a sufficiently high thermal conductivity, preferably Silicon Carbide, Silicon Carbide coated graphite, or silicon.

Figure 12:
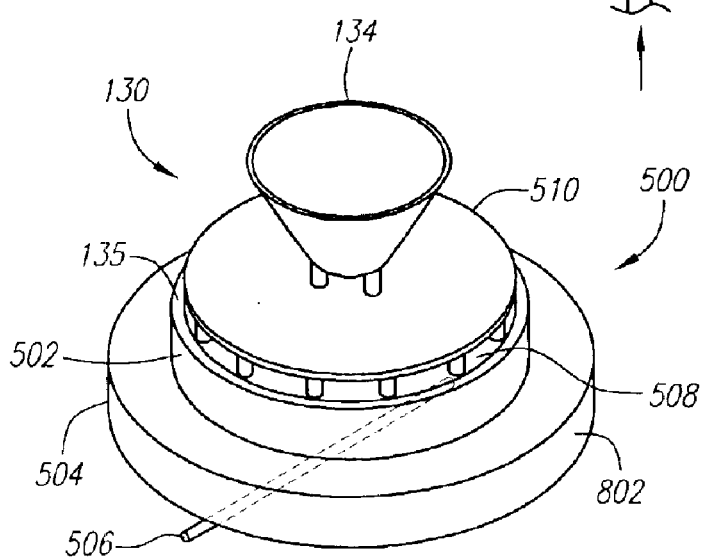

In this embodiment, heat source 506 is disposed within the hollowed out portion of second tier 504. Alternatively, heat source 506 is positioned outside of fixed platform 802 (FIG. 12) Heat source 506 may include a high intensity lamp 506, or a plurality of high intensity lamps, that provide photon energy. Examples of high intensity lamp 506 include, but are not limited to, a Tungsten halogen lamp, metal halide lamp, discharge (arc) lamp and any filament-less high intensity lamp. Lamp 506 outputs photon energy which is allowed to emanate from second tier 504 through first tier 502 and escape through quartz window 508. Heat diffusing member 510 absorbs the photon energy emanating from window 508 and dissipates the photon energy as thermal energy into process tube 104. Gases circulating through process tube 104 are directed by reflector 134 toward heat diffusing member 510 such that the temperature of the circulating gas is increased in accordance with the present invention.

Figure 6:
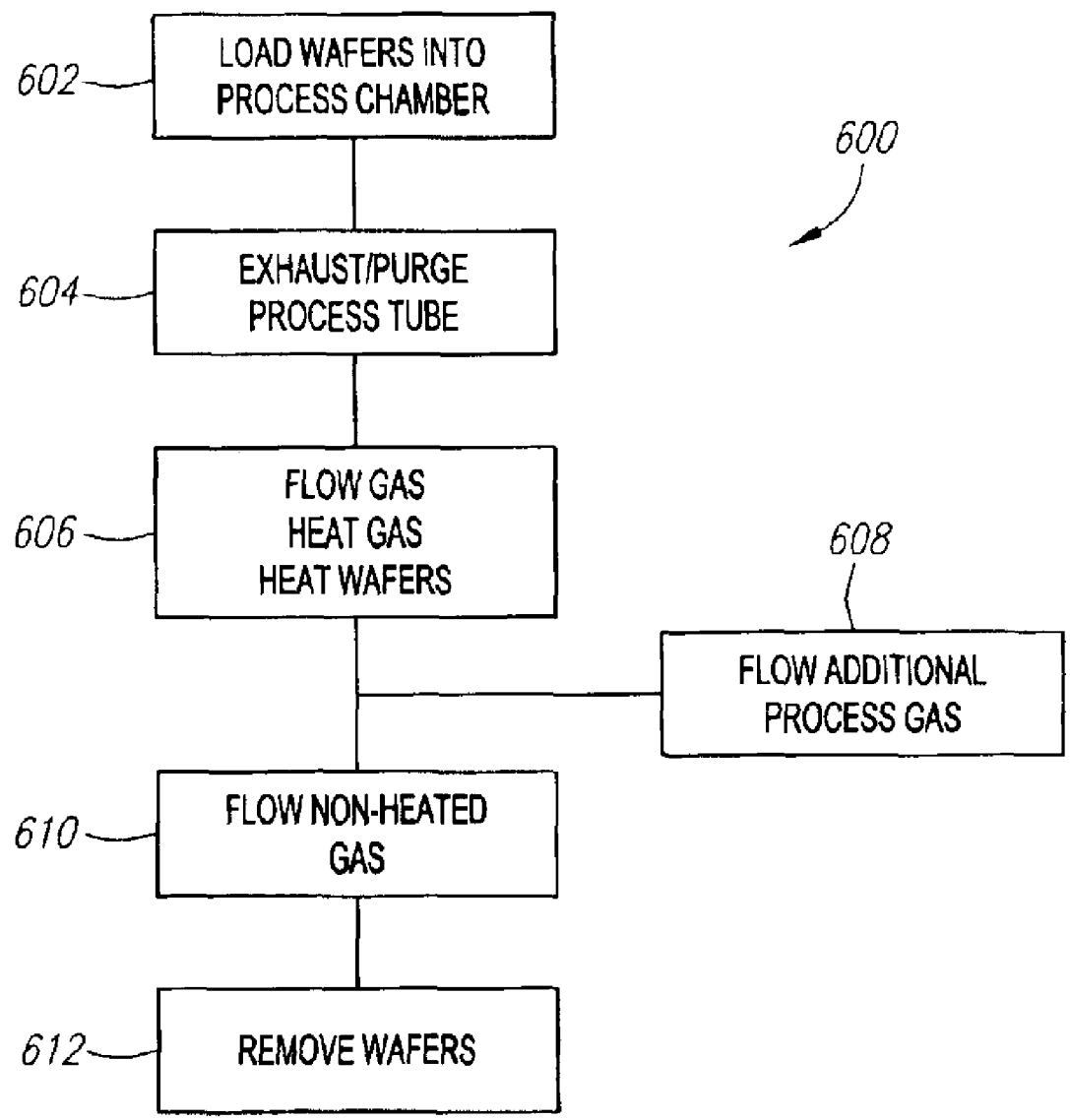
FIG. 6 is a flow diagram illustrating a method in accordance with the system of the present invention.

FIG. 6 is a flow diagram outlining a method of operation 600 in accordance with the present invention. In operation, platform 138, including wafer carrier mounting means 132, reflector 134, and heat source 136 is moved between a first position or loading position, where wafer carrier 128 may be manually loaded/unloaded or else may be automatically loaded/unloaded onto platform 138 and a second position or processing position where wafer carrier 128 is within process tube 104.

In step 602, wafers 126 are loaded via wafer carrier 128 onto the wafer carrier mounting means 132. Elevation means 150 lifts platform 138 into sealing contact with flange 140. Wafers 126 are now in position for processing.

In step 604, process tube 104 can be pumped down to substantially at or near vacuum and a purging gas, such as $N_2$, Ar, and similar gases can be allowed to flow via inlet tube 122 into process tube 104. Discharge tube 124 exhausts the gas from process tube 104. The combination of effects from inlet tube 122 and discharge tube 124 cause the gas to circulate and be purged from within process tube 104. Using the pump and purge technique allows process tube 104 to be purged of air, for example, in one embodiment, the residual $O_2$ level in process tube 104 can be reduced to about 1000 ppm and may be reduced to less than 1 ppm.

Once process tube 104 has been purged, in step 606, a process gas is allowed to flow into process tube 104. While the gas is flowing, heat source 136 is powered-up. The process gas circulating through process tube 104 absorbs thermal energy from heat source 136. The circulating process gas then circulates about wafers 126 to transfer the thermal energy to wafers 126. Reflector 134 is shaped like a funnel to direct a least a portion of the circulating process gas toward heat source 136 to facilitate the transfer of thermal energy to the process gas.

Heat source 136 is controlled using a microprocessor, process control computer and the like to control the processing of the semiconductor wafers placed in process tube 104 and may be used to monitor the status of the system for diagnostic purposes. In one embodiment, the process computer provides control signals to a controller in response to temperature data received from temperature sensor 106a at the top end of process tube 104 and sensor 106b at the bottom end of process tube 104. The controller provides control signals to an SCR-based phase controlled power supply, which provides power to heating source 136. The controller compares the temperature between sensors 106a and 106b to ensure that equilibrium is being achieved in process tube 104 and that the power supply is not causing heat source 136 to overheat the bottom end of process tube 104.

The process computer may also direct pressure setpoints to a pump assembly (not shown) as well as gas and plasma inlet flow signals to mass-flow controllers (not shown) in a gas network. In a preferred embodiment, the controller is a real-time PID, available from Omega Corporation.

Once wafers 126 are at processing temperatures, in step 608, additional process gases may be allowed to flow into process tube 104 to further process wafers 126. These gases may include, for example, $O_2$, $NH_3$, TaETO, $SiCl_4$ and the like, for film deposition and thermal processes, including annealing, baking, outgassing, photoresist removal (ashing), curing, oxidation, nitridation, densification, drying and the like.

In step 610, heat source 136 is powered down to stop the transfer of thermal energy to the circulating gas in process tube 104. As non-heated gas continues to circulate through process tube 104, wafers 126 begin to transfer thermal energy to the non-heated gas, thus, cooling wafers 126.

In step 612, platform 138 is lowered away from process tube 104 once a desired wafer temperature has been achieved and wafer carrier 128 can be removed.

Figure 7:
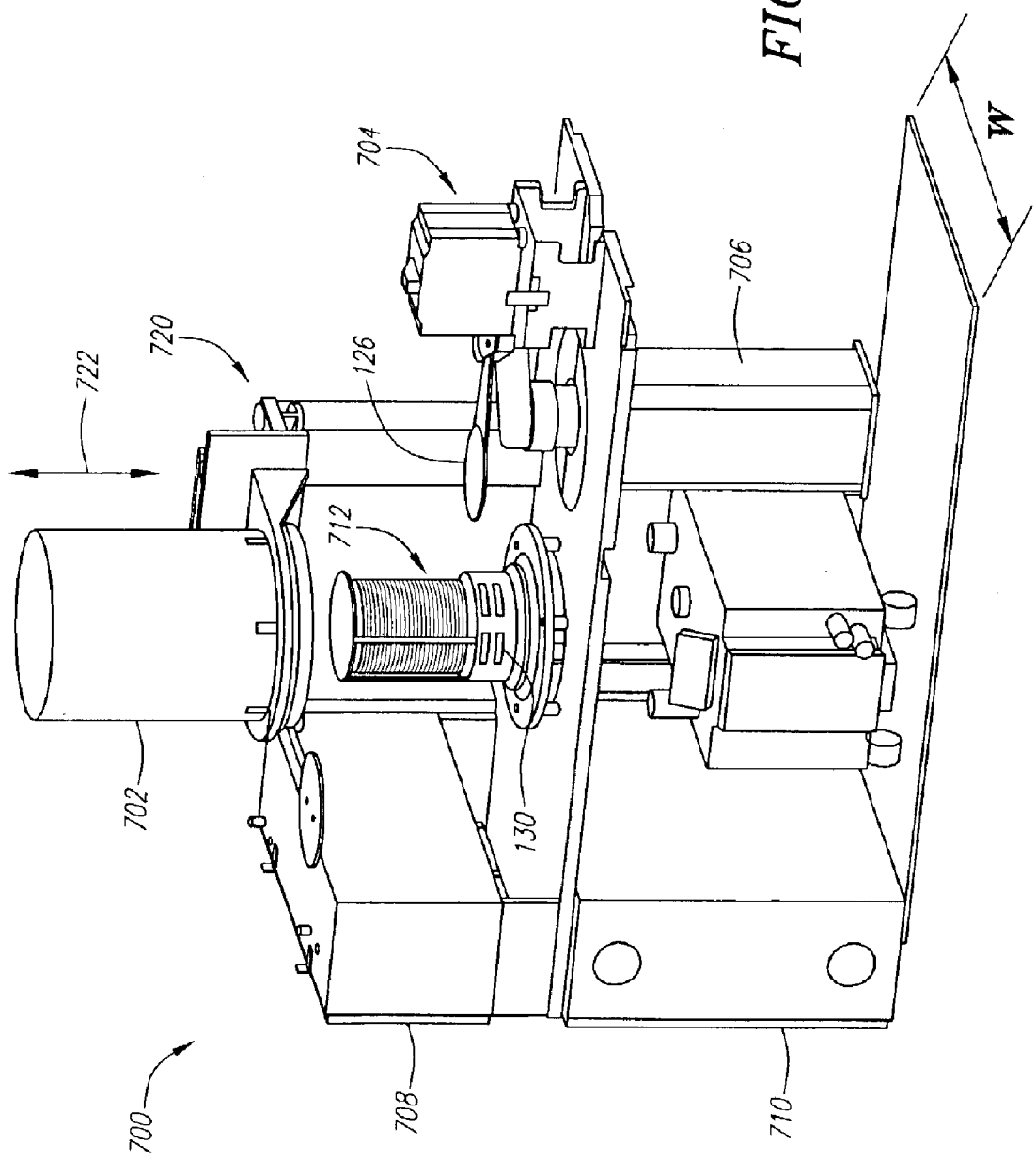
FIG. 7 is a simplified perspective view of an alternative embodiment of the processing system of the present invention.

FIG. 7 is a simplified illustration of an alternative embodiment of the present invention, having a wafer processing system 700, which includes a furnace assembly 702, a wafer cassette 704, a wafer boat 712, a wafer transport mechanism 706, a gas supply box 708, a power controller 710, and internal heating assembly 130.

Figure 8:
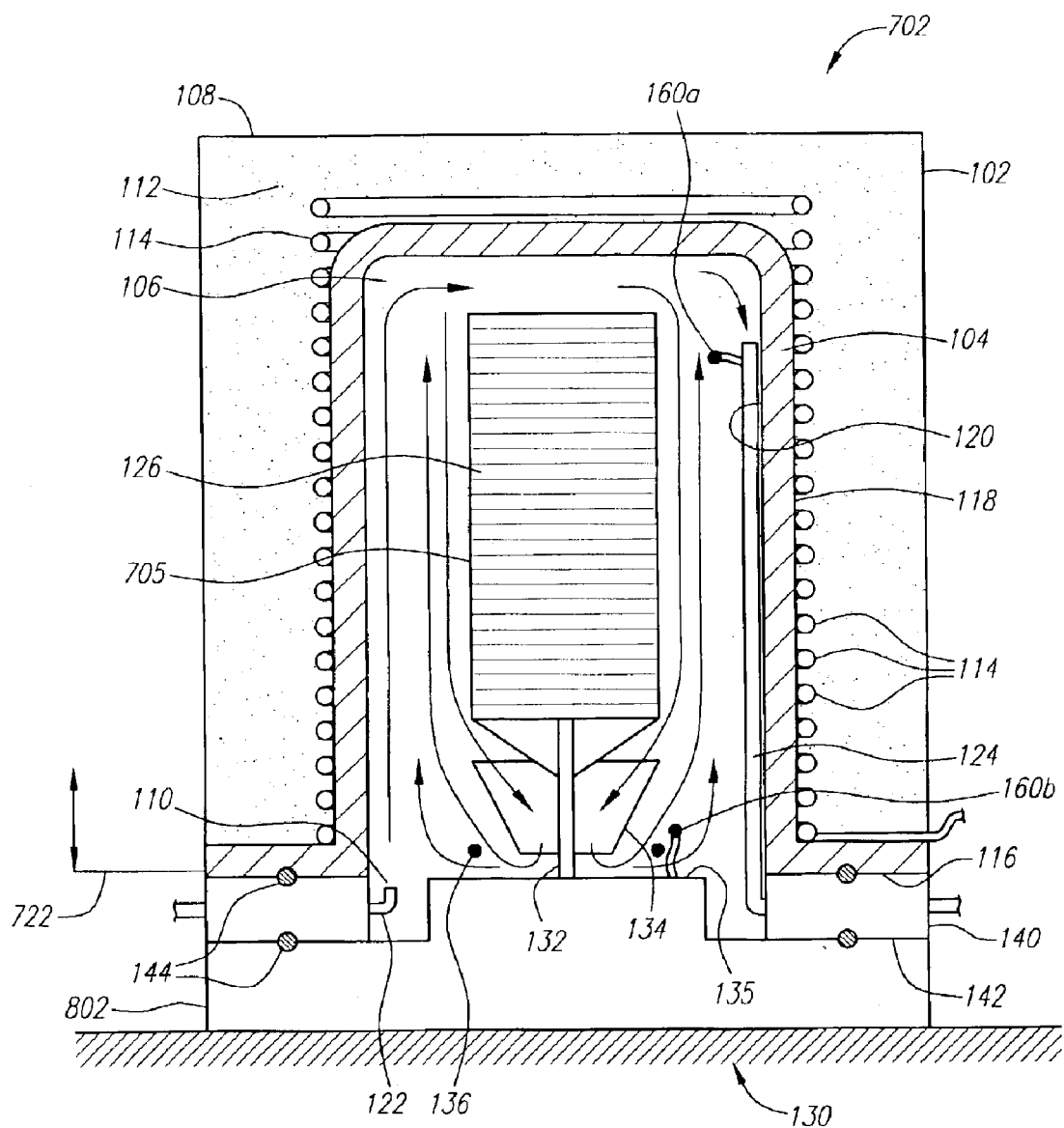
FIG. 8 is a simplified cross-sectional view of an alternative embodiment of the furnace assembly of the present invention.

As understood with reference to FIG. 8, furnace assembly 702 includes, for example, a process chamber 102 enclosing a process tube 104, which defines an internal space 106. Within process chamber 102, between housing 108 and process tube 104, may be an internal thermal insulation material 112. Optionally, a heating element or a plurality of heating elements 114 may be disposed between process tube 104 and insulation layer 112 to increase the temperature around process tube 104, which further minimizes heat loss through the housing to the outside environment and to reduce time for the temperature within process tube 104 to stabilize.

As shown in FIG. 7, a wafer boat 712 is provided, which is capable of holding a plurality of wafers 126 in an array configured for processing. Wafer boat 712 is loaded with wafers 126 via transport mechanism 706 from wafer cassette 704. Process tube 104 and wafer boat 712 are constructed so as to be arranged in a coaxial arrangement, in which wafer boat 712 can be removably received within process tube 104. In one embodiment, wafer boat 712 may be configured to be coupled to a fixed platform 802 along with heating assembly 130.

Referring now to FIGS. 7 and 8, an elevation device 720 can be used to move furnace assembly 702 up and down in the direction signified by arrow 722. Elevation device 720 can be any well-known device cable of performing the lifting and lowering operations required to move furnace assembly 702 over wafer boat 712 and heating assembly 130 for the processing of wafers 226. For example, elevation device 720 can include a pneumatic or hydraulic lift, a mechanical worm drive or any other linear actuation device known in the industry.

The sealing of process tube 104 occurs as lip portion 142 of fixed platform 802 contacts a flange 140 or similar device formed as an interface between process chamber 102 and fixed platform 802. In one embodiment, inlet tube 120 and discharge tube 122 can be provided through flange 140 to extend into process tube 104. In one embodiment, seals 144 are positioned between the contacting portions of process chamber 102 and flange 140 and contacting portions of flange 140 and lip portion 142. Seals 144 allow process tube 104 to be hermetically sealed during processing.

Figure 9A:
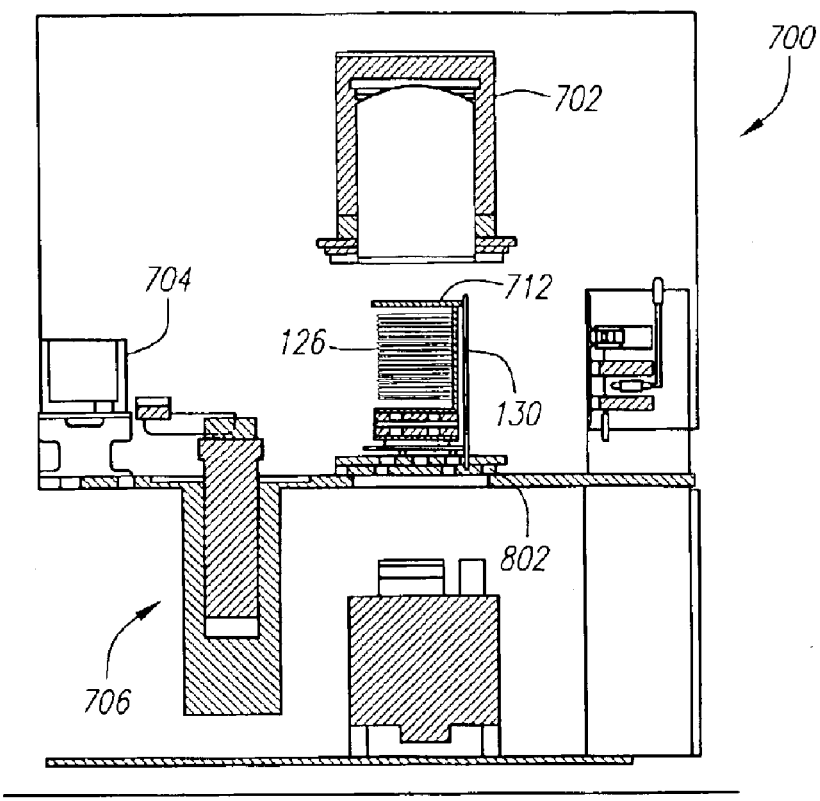
FIGS. 9A, 9B and 9C are simplified cross-sectional views of operating sequences in accordance with the present invention.
Figure 9B:
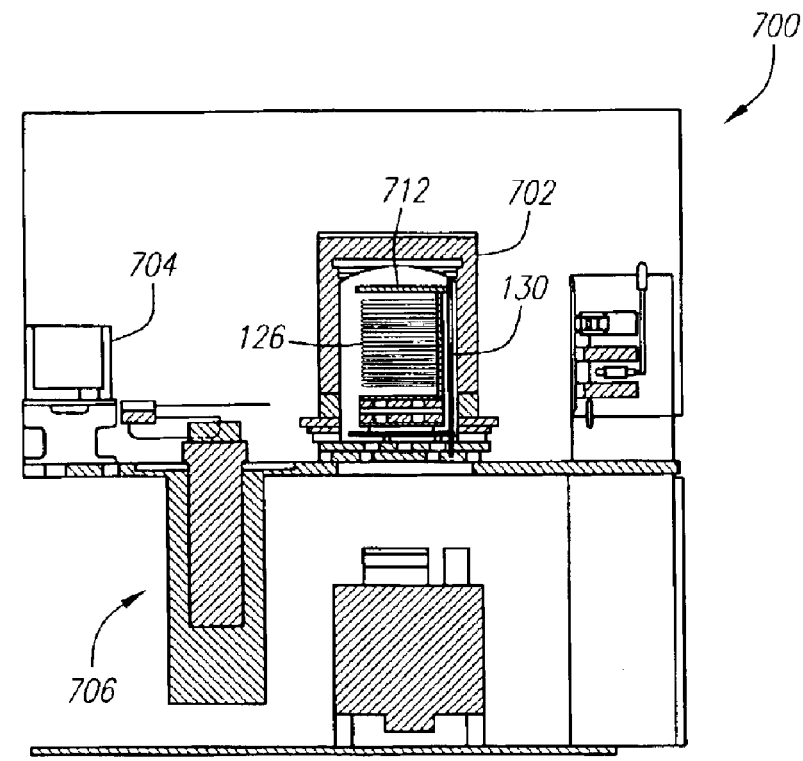
Figure 9C:
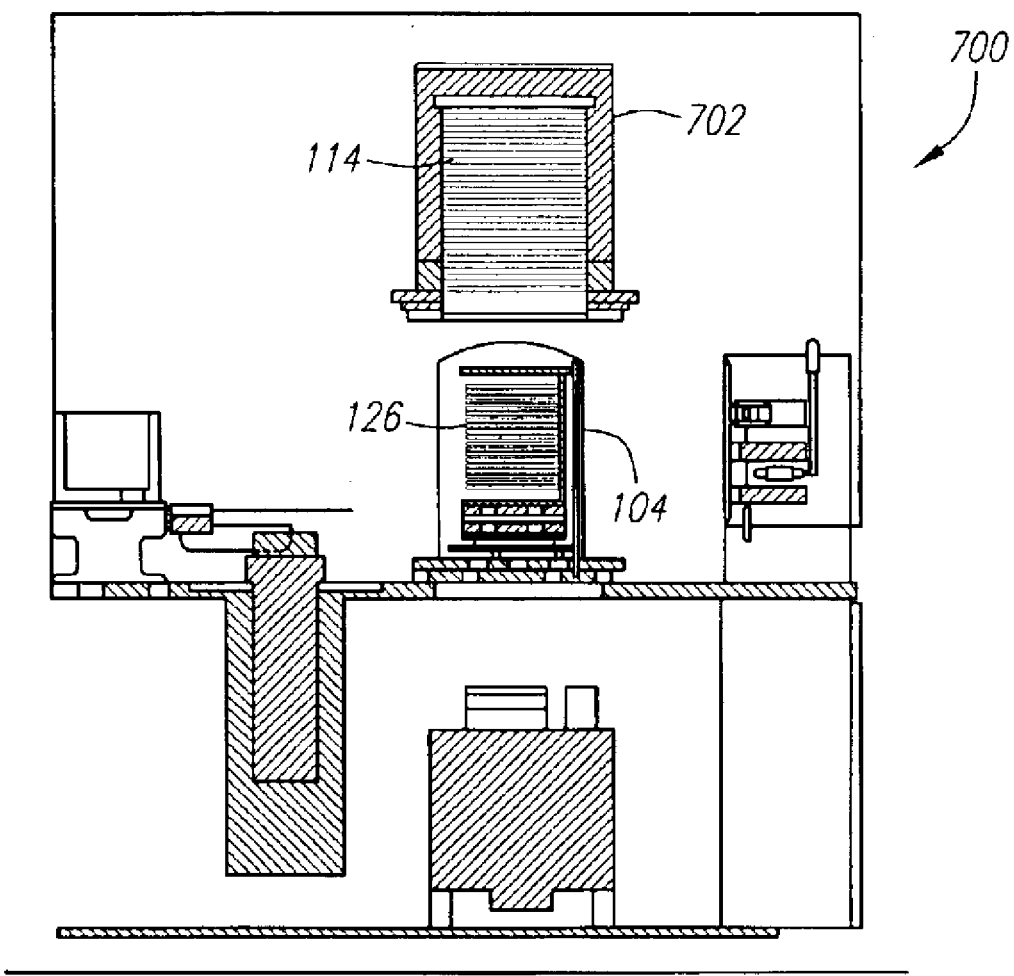
Figure 10:
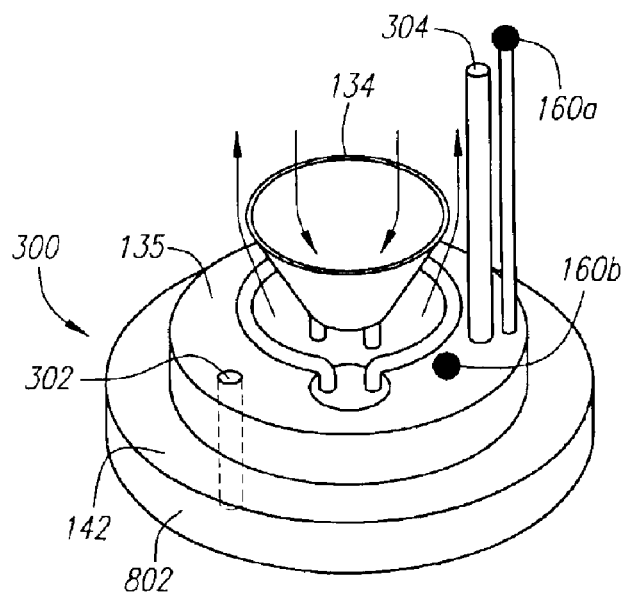
FIGS. 10, 11 and 12 are simplified perspective views of heating assemblies in accordance with embodiments of the present invention.
Figure 11:
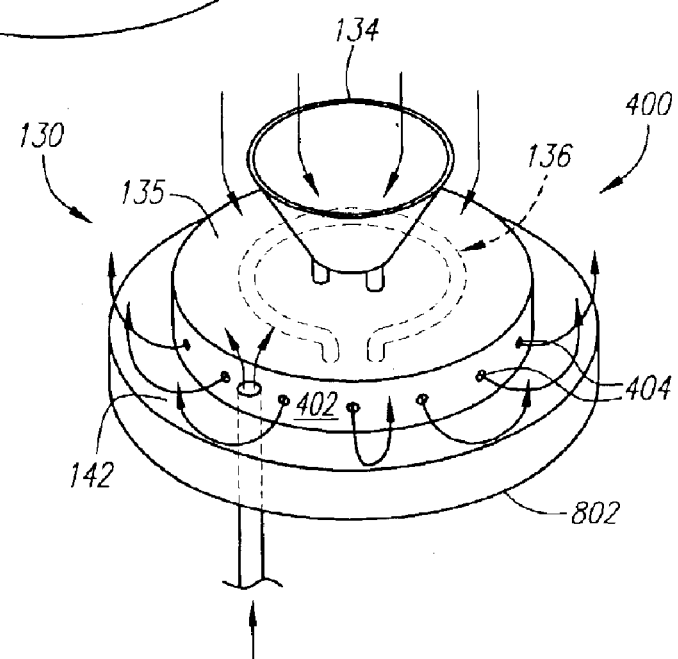

FIGS. 9A, 9B and 9C show operational sequences of processing system 700 in accordance with the present invention. It should be understood that, except where indicated, the performance, function and combination of embodiments described above with regard to furnace assembly 100 are applicable to furnace assembly 702.

The components of processing system 700 are operationally arranged to provide an efficient use of space. For example, in one embodiment, processing system 700 occupies a space having a width W (FIG. 7) of about 900 mm, a length L of about 1710 mm and a height H of about 1925 mm.

Referring to FIG. 9A, processing system 700 is shown in the load/unload sequence of operation. Wafer boat 712 is shown positioned above heating assembly 130, both of which are positioned on fixed platform 802. Wafer boat 712 and heating assembly 130 are sized and assembled to fight in a coaxial arrangement within furnace assembly 702.

In FIG. 9A, furnace assembly 702 is in a first position raised above platform 802. Process tube 104 is made coaxial with the stacked arrangement of wafer boat 712 and heating assembly 130. In the first position process tube 104 of furnace assembly 702 is clear of contact with platform 802. Furnace assembly 702 can be raised and lowered along a distance d above platform 802. Distance d is determined based on the combined height of wafer boat 712 and heating assembly 130 and the desired clearance between wafer boat 712 and furnace assembly 702 for unloading wafers 126. In one embodiment, distance d can range up to about 550 mm.

Once wafer transport mechanism 706 has moved wafers from wafer cassette 704 to wafer boat 712, furnace assembly 702 can be lowered to a second position where process tube 104 contains and encloses wafer boat 712 and heating assembly 130.

As shown in FIG. 9B, once furnace assembly 702 with process tube 104 is lowered to rest on platform 802 and a seal is acquired, process tube 104 can be purged in preparation for wafer processing. The wafer processing occurs as described above with regard to furnace assembly 100 and heating assembly 130. It should be understood that heating assembly 130 as used in the present embodiment may take many forms, including those described in reference to FIGS. 2 and 10–12, with the exception of elevation means 150.

After the processing sequence is completed, and upon reaching a safe, slip-free temperature, a significant acceleration in temperature ramp-down rate can be achieved by flowing a gas through process tube 104 in the absence of heat energy from heating assembly 130. In addition, vertically raising furnace assembly 702 away from wafer boat 712 and heating assembly 130 can also provide accelerated wafer cooling.

As shown in FIG. 9C, furnace assembly 702 has a design, which provides easy access to all major components of the assembly, such as process tube 104, and heating elements 114. The modular design allows for ease of maintenance.

Having thus described the preferred embodiments, persons skilled in the art will recognize that changes may be made in form and detail without departing from the spirit and scope of the invention. Thus the invention is limited only by the following claims.

What is claimed is:

1. A wafer processing system comprising:
   a process chamber including a process tube configured to receive a wafer carrier which supports one to a plurality of semiconductor wafers;
   a heating assembly mounted on a platform proximate to said wafer carrier, said process chamber moveable from a first position where said heating assembly and said wafer carrier are positioned outside of said process tube and a second position where said heating assembly and said wafer carrier are positioned within said process tube, wherein said heating assembly comprises a heat source and a funneling device having a first opening proximate to said wafer carrier and a second opening smaller than the first opening proximate to said heat source for directing gas flow to said heat source.

2. The system of claim 1, wherein said heat source comprises a resistive heating element.

3. The system of claim 1, wherein said heat source comprises a lamp selected from the group consisting of a halogen lamp, a metal halide lamp and discharge (arc) lamp.

4. The system of claim 1, wherein said heating assembly further comprises a wafer carrier mounting means.

5. The system of claim 1, wherein further comprising an elevation mechanism for moving said process chamber from between said first position and said second position.

6. A furnace assembly for processing a plurality of semiconductor wafers, the assembly comprising;
   a moveable process chamber including a process tube configured to receive a wafer carrier configured to support a plurality of semiconductor wafers;
   an inlet for allowing a gas to flow into said process tube;
   a heat source configured to be received within said process tube, where a thermal energy output from said heat source is transferred to said gas to provide a processing temperature throughout said process tube; and
   a funneling device having a first opening proximate to said wafer carrier and a second opening smaller than the first opening proximate to said heat source for directing said gas to said heat source.

7. The assembly of claim 6, wherein said moveable process chamber is moveable from a first position where said heat source is positioned outside of said process tube and a second position where said heat source is positioned within said process tube.

8. The assembly of claim 6, wherein said heat source increases the temperature of said gas from between 100° C. to about 1200° C.

9. The assembly of claim 6, wherein said heat source comprises a resistive heating element.

10. The assembly of claim 6, wherein said heat source comprises a lamp selected from the group consisting of a halogen lamp, a metal halide lamp and discharge (arc) lamp.

11. The assembly of claim 6, further comprising a fixed platform upon which said heat source is mounted, said moveable process chamber being moveable between a first position where said fixed platform is free of contact with said process chamber and said second position where said fixed platform is in sealing contact with said process chamber.

12. The assembly of claim 6, further comprising a fixed platform, said heat source being disposed within a portion of said process tube when said moveable process chamber is moved to a position to contact said fixed platform.

13. A furnace assembly for processing a plurality of semiconductor wafers, the assembly comprising:
   a moveable process chamber including a process tube configured to receive a wafer carrier configured to support a plurality of semiconductor wafers;
   an inlet for allowing a gas to flow into said process tube; and
   a heat source configured to be received within said process tube, where a thermal energy output from said heat source is transferred to said gas to provide a processing temperature throughout said process tube; and
   a fixed platform having a working surface comprising a quartz window and a heat diffusing member being mounted above and proximate to said quartz window, wherein thermal energy is provided to said heat diffusing member to create said heat source, said moveable process chamber being moveable between a first position where said fixed platform is free of contact with said moveable process chamber and said second position where said fixed platform is in sealing contact with said moveable process chamber.

14. The assembly of claim 6, further comprising a gas circulation means for causing said gas to circulate around said process tube.

15. A method for processing wafers comprising:
   moving a process tube to a first position enclosing a heat source;
   providing thermal energy from said heat source;
   circulating a first gas within said process tube and directing said first gas from said wafers to said heat source, said first gas absorbing said thermal energy and thermodynamically transferring said thermal energy to said wafers; and thereafter
   ceasing said providing thermal energy from said heat source; and
   circulating a second gas within said process tube, said second gas absorbing thermal energy from said wafers causing a temperature of said wafers to be reduced.

16. The method of claim 15, further comprising moving said process tube to a second position free from enclosing said heat source.

17. The method of claim 15, wherein said moving of said process tube to said first position comprises isolating said process tube.

18. The method of claim 15, wherein said heat source comprises a resistive heating element.

* * * * *